US009263571B2

(12) United States Patent
Tsuchiya et al.

(10) Patent No.: US 9,263,571 B2
(45) Date of Patent: Feb. 16, 2016

(54) SILICON CARBIDE SEMICONDUCTOR DEVICE AND MANUFACTURING METHOD THEREOF

(71) Applicant: HITACHI, LTD., Chiyoda-ku, Tokyo (JP)

(72) Inventors: Ryuta Tsuchiya, Tokyo (JP); Hiroyuki Matsushima, Tokyo (JP); Naoki Tega, Tokyo (JP); Digh Hisamoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/651,555

(22) PCT Filed: Dec. 28, 2012

(86) PCT No.: PCT/JP2012/084023
§ 371 (c)(1),
(2) Date: Jun. 11, 2015

(87) PCT Pub. No.: WO2014/103000
PCT Pub. Date: Jul. 3, 2014

(65) Prior Publication Data
US 2015/0318389 A1 Nov. 5, 2015

(51) Int. Cl.
*H01L 29/78* (2006.01)
*H01L 29/16* (2006.01)
*H01L 29/66* (2006.01)
*H01L 21/02* (2006.01)
*H01L 29/10* (2006.01)
*H01L 29/06* (2006.01)

(52) U.S. Cl.
CPC ...... *H01L 29/7802* (2013.01); *H01L 21/02529* (2013.01); *H01L 29/0696* (2013.01); *H01L 29/1095* (2013.01); *H01L 29/1608* (2013.01); *H01L 29/66712* (2013.01)

(58) Field of Classification Search
CPC ......... H01L 29/12; H01L 29/66; H01L 29/78; H01L 29/666666; H01L 29/7827
See application file for complete search history.

(56) References Cited

U.S. PATENT DOCUMENTS

| 6,956,239 | B2 * | 10/2005 | Sriram | H01L 29/8128 257/280 |
| 2007/0120168 | A1 * | 5/2007 | Sriram | H01L 29/1029 257/300 |
| 2012/0070954 | A1 * | 3/2012 | Fung | H01L 21/2257 438/303 |

FOREIGN PATENT DOCUMENTS

| JP | 2001-094098 A | 4/2001 |
| JP | 2002-093742 A | 3/2002 |
| JP | 2004-335917 A | 11/2004 |

*Primary Examiner* — Tan N Tran
*Assistant Examiner* — Fazli Erdem
(74) *Attorney, Agent, or Firm* — Miles & Stockbridge P.C.; Eric G. King

(57) ABSTRACT

When a gate length is reduced for the purpose of reducing on-resistance in a SiC DOMSFET, it is difficult to achieve both of the reduction of on-resistance by the reduction of gate length and the high element withstand voltage at the same time. In the present invention, a body layer is formed after the source diffusion layer region is formed and then a portion of the source diffusion layer region is recessed. Because of the presence of the body layer, the distances between the source diffusion region and respective end portions can be increased, a depletion layer is effectively expanded, and electric field concentration at the end portions can be suppressed, thereby improving withstand voltage characteristics. Consequently, the present invention can provide a silicon carbide semiconductor device that achieves both of the reduction of channel resistance by the reduction of gate length and the high element withstand voltage at the same time.

8 Claims, 17 Drawing Sheets

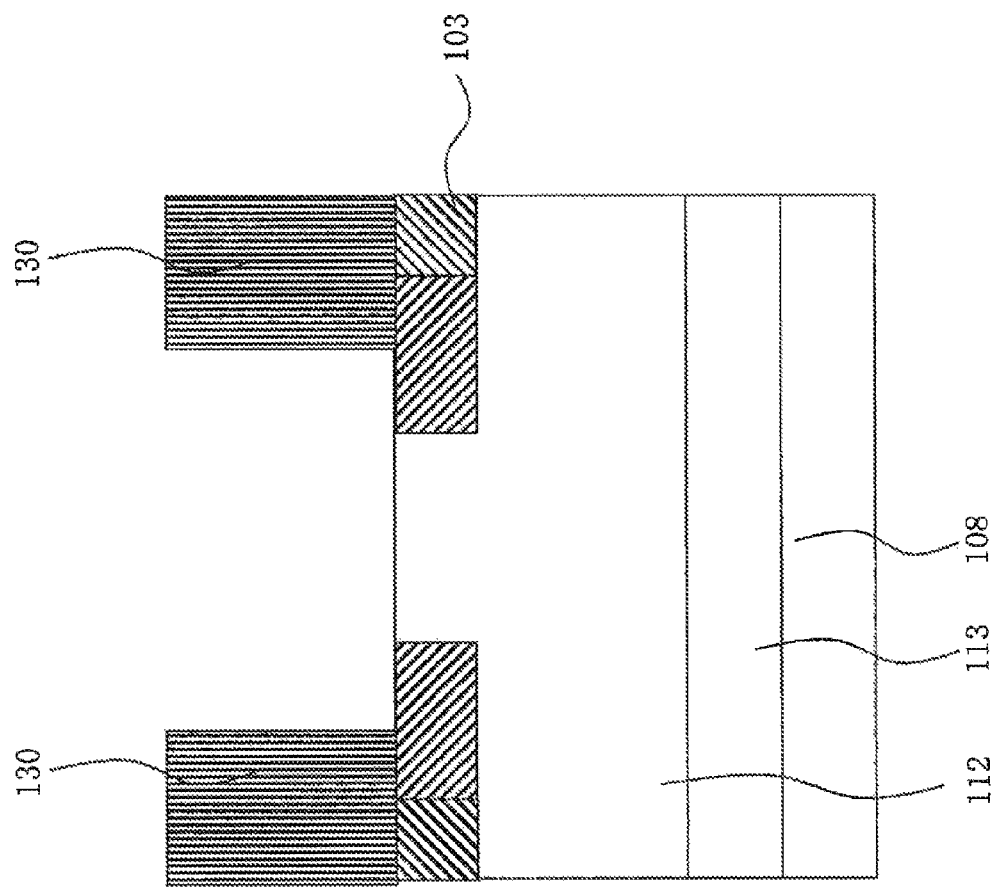

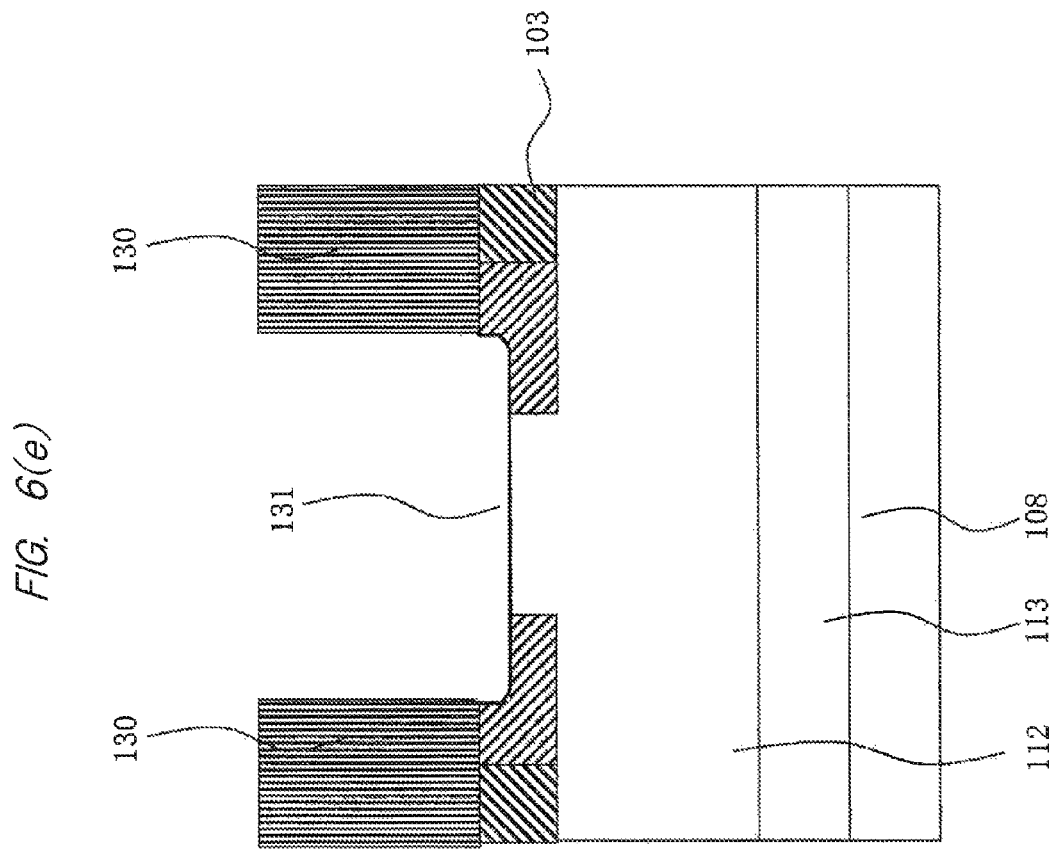

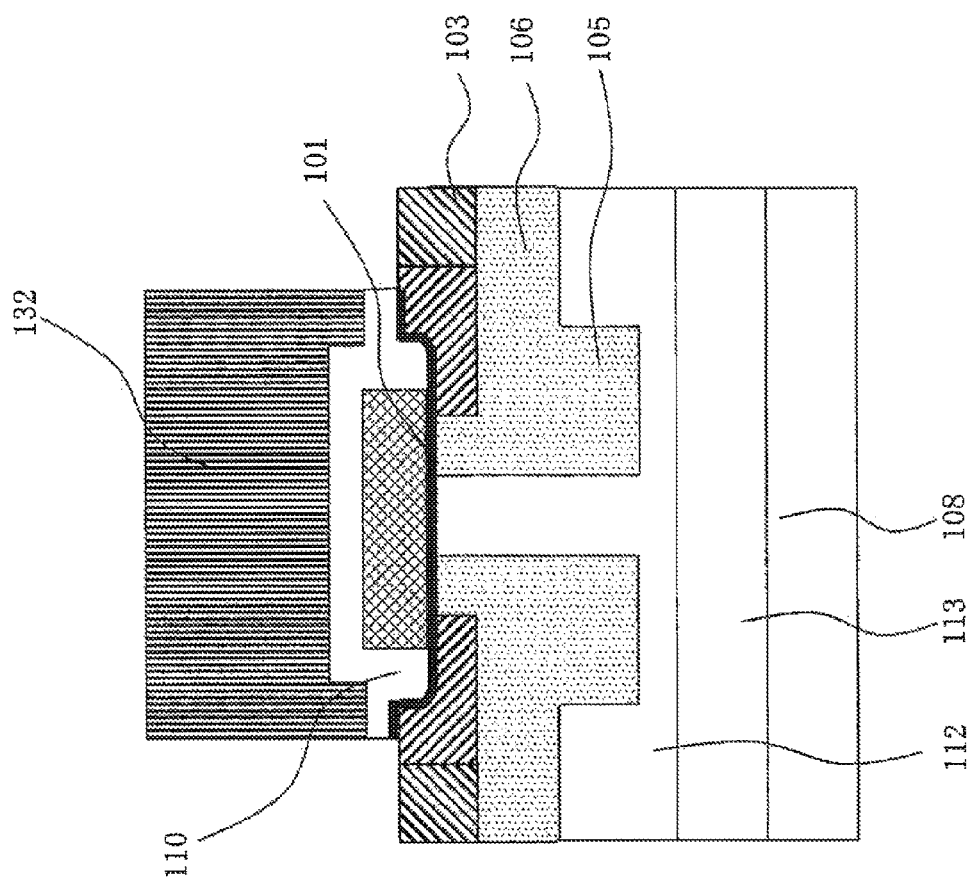

SILICON CARBIDE SEMICONDUCTOR DEVICE AND MANUFACTURING METHOD THEREOF

TECHNICAL FIELD

The present invention relates to a silicon carbide semiconductor device and a manufacturing method thereof.

BACKGROUND ART

As a power device to be used in an inverter or the like, the use of a SiC-MOSFET (Metal-Oxide-Semiconductor Field-Effect Transistor) utilizing a silicon carbide substrate has been proposed (Patent Document 1). One of the problems related to the on-resistance of this SiC-MOSFET is a low channel mobility that is inherent to SiC. In general, a 4H—SiC substrate is used as a substrate thereof. The 4H—SiC substrate has two surfaces of a Si surface and a C surface, and in the case of, for example, a general DMOSFET (Double-diffused MOSFET) using a Si surface as a channel, even when the application of a SiON film (silicon oxynitride film) to a gate insulating film and the use of a buried channel which are considered to be useful for the improvement of channel mobility are taken into consideration, the channel mobility is as low as 50 $cm^2/Vs$ or less. This is smaller by one order of magnitude in comparison with that of a Si-MOSFET. For this reason, among the parasitic resistance components of the SiC power MOSFET, the ratio occupied by the channel resistance component is the highest. Even when the C surface having a comparatively high channel mobility is utilized, the problem of this high channel resistance still remains as a big problem of the SiC power MOSFET.

Because of the presence of the problem of this low channel mobility, in the conventional technique, the gate length of the DMOSFET is shortened so as to reduce the channel resistance, thereby reducing the on-resistance of the DMOSFET.

RELATED ART DOCUMENTS

Patent Documents

Patent Document 1: Japanese Patent Application Laid-Open Publication No. 2001-94098

SUMMARY OF THE INVENTION

Problems to be Solved by the Invention

When the gate length is reduced in the conventional technique, a problem arises in that the withstand voltage characteristics of the DMOSFET are degraded. The problem will be described with reference to a conventional DMOSFET structure shown in FIG. 3. When the gate length is reduced in the conventional technique, the distance between respective end portions of a source diffusion layer 102 and a body layer 106 is physically shortened. Therefore, when a voltage of several hundreds to several thousands V is applied to the drain electrode of the DMOSFET, it is not possible to effectively extend a depletion layer in these end portions, with the result that the electric field is concentrated. As a result, since a so-called punch through occurs through the source diffusion layer 102, the body layer 106 and the drift layer 112 to allow a leakage current to flow, the withstand voltage is lowered. In other words, it has been difficult to achieve both of the on-resistance reduction by the reduction of gate length and the high element withstand voltage at the same time.

An object of the present invention is to provide a DMOSFET structure that can achieve both of low on-resistance and high withstand voltage in the device at the same time.

Means for Solving the Problems

The following is a brief description of an outline of the typical invention disclosed in the present application.

The present invention provides a silicon carbide semiconductor device which includes: a substrate of a first conductivity type having a first main surface and a second main surface opposite to the first main surface and made of silicon carbide; an epitaxial layer made of silicon carbide formed on the first main surface of the substrate; a first body layer of a second conductivity type different from the first conductivity type formed in the epitaxial layer; a second body layer of the second conductivity type different from the first conductivity type formed in the epitaxial layer; a first source region of the first conductivity type formed in the first body layer; a second source region of the first conductivity type formed in the second body layer; a first channel region of the second conductivity type formed in contact with the first source region positioned in the first body layer located between a lateral end portion of the first body layer and a lateral end portion of the first source region; a second channel region of the second conductivity type formed in contact with the second source region positioned in the second body layer located between a lateral end portion of the second body layer and a lateral end portion of the second source region; a gate insulating film formed in contact with the first channel region and the second channel region; a gate electrode formed in contact with the gate insulating film; and a drain region of the first conductivity type formed in the substrate so as to have a predetermined depth from the second main surface of the substrate, and the first and second source regions and the first and second channel regions are recessed. In the silicon carbide semiconductor device, a junction depth of the body layer in a region where the source region and the channel region are recessed is deeper than a junction depth of the body layer in a region where the source region is not recessed.

According to the present invention described above, in comparison with the conventional technique, since a body layer is formed after a source diffusion layer region is formed and a part thereof is then recessed, a body layer 105 is formed as shown in FIG. 1. In comparison with the conventional structure, since the presence of the body layer 105 makes it possible to widen the distances between the respective end portions and the source diffusion layer 102, it becomes possible to effectively widen the depletion layer and thus prevent the electric field from concentrating on these end portions. FIG. 4 and FIG. 5 show the calculation results of the electric field distribution of the conventional structure and the structure of the present invention obtained by using a device simulator, respectively. It is found that the electric field concentration at the end portions of the body layer is suppressed in the structure of the present invention shown in FIG. 5 in comparison with the conventional structure shown in FIG. 4.

Effects of the Invention

As described above, according to the present invention, it is possible to provide a silicon carbide semiconductor device capable of achieving both of the reduction of a channel resistance by the reduction of the gate length and the high element withstand voltage at the same time.

BRIEF DESCRIPTIONS OF THE DRAWINGS

FIG. 6(d) is an explanatory cross-sectional view for describing the manufacturing method of the silicon carbide semiconductor device;

FIG. 6(e) is an explanatory cross-sectional view for describing the manufacturing method of the silicon carbide semiconductor device;

FIG. 6(j) is an explanatory cross-sectional view for describing the manufacturing method of the silicon carbide semiconductor device;

DETAILED DESCRIPTION OF PREFERRED EMBODIMENTS

First Embodiment

Hereinafter, the first embodiment will be described in detail with reference to accompanying drawings.

Figure 1:
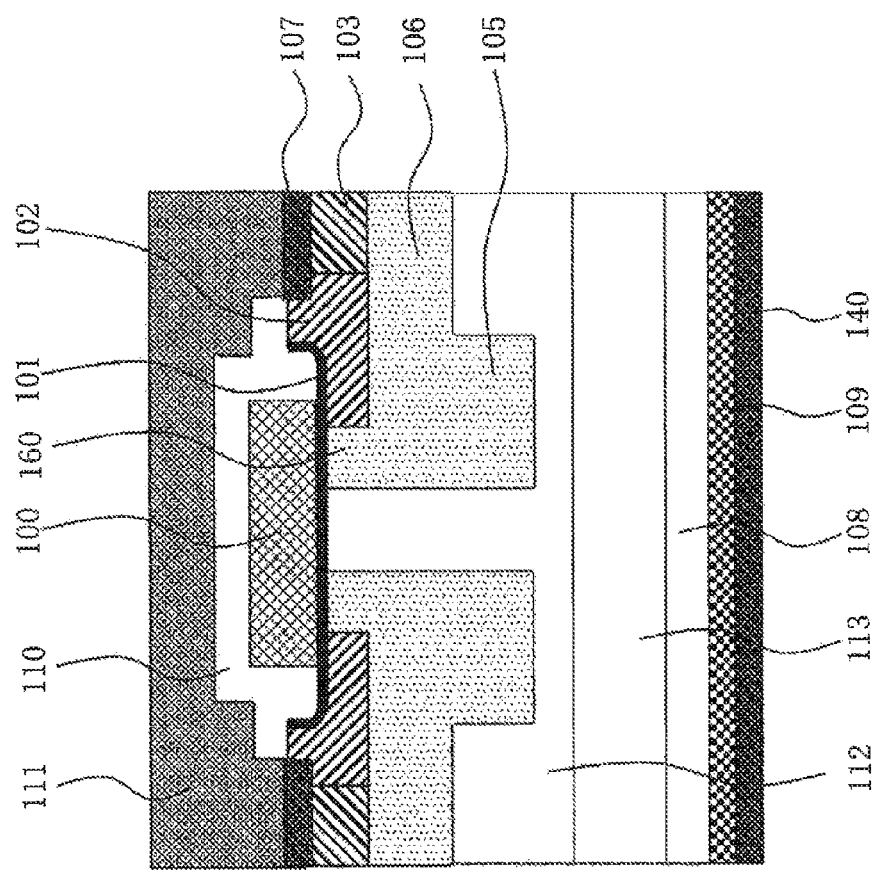
FIG. 1 is an explanatory diagram showing a cross-sectional structure of a silicon carbide semiconductor device according to the first embodiment.

FIG. 1 is a schematic cross-sectional view showing a silicon carbide semiconductor device of the first embodiment. The silicon carbide semiconductor device has a structure in which a plurality of unit cells of DMOSFET are arranged. Note that FIG. 1 shows only a part of the plurality of unit cells.

A reference character 113 denotes a SiC substrate and a SiC epitaxial substrate is made up of the SiC substrate 113 and an epitaxial layer 112 formed on the SiC substrate 113. On a front surface of the SiC epitaxial substrate, body layers 105 and 106 constituting a channel region of a MOSFET and a source diffusion layer region 102 constituting a source region of the MOSFET are formed. The channel region is denoted by 160. On a rear surface of the SiC epitaxial substrate, a drain diffusion layer region 108 constituting a drain region of the MOSFET is formed. A reference character 103 denotes a p⁺ layer for fixing a potential of each of the body layers 105 and 106. A reference character 100 denotes a gate electrode of the MOSFET, and 101 denotes a gate insulating film. A reference character 110 denotes an interlayer film. A reference character 107 denotes a metal silicide layer on a front surface of the SiC epitaxial substrate, and 109 denotes a metal silicide layer on a rear surface of the SiC epitaxial substrate. A reference character 111 denotes a source wiring electrode, and 140 denotes a drain wiring electrode on the rear surface.

The gate electrode 100 is electrically connected to a gate wiring electrode (not shown) and a gate potential supplied from outside is applied to the gate wiring electrode. Also, a source potential supplied from outside is applied to the source wiring electrode 111, and a drain potential supplied from outside is applied to the drain wiring electrode 140.

Figure 2:
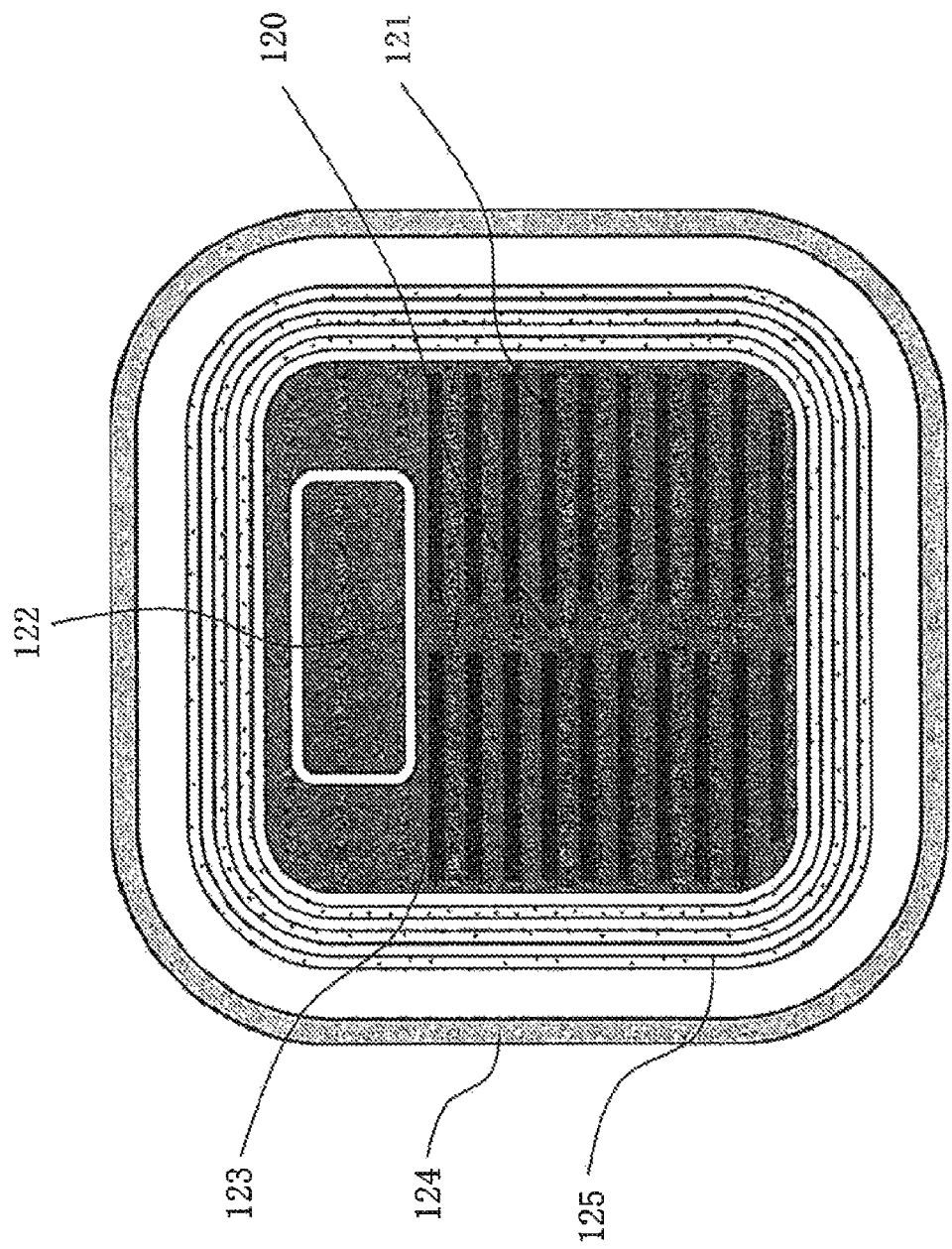
FIG. 2 is an explanatory diagram showing a planar structure of the silicon carbide semiconductor device according to the first embodiment.
Figure 3:
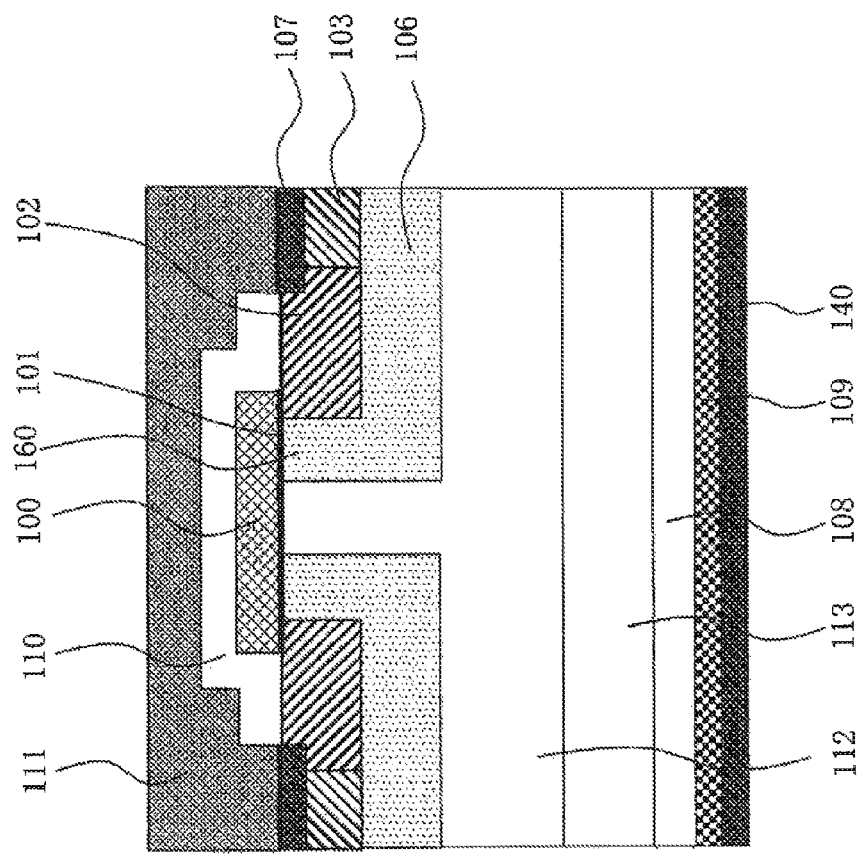
FIG. 3 is an explanatory diagram showing a cross-sectional structure of a silicon carbide semiconductor device according to a conventional technique.
Figure 4:
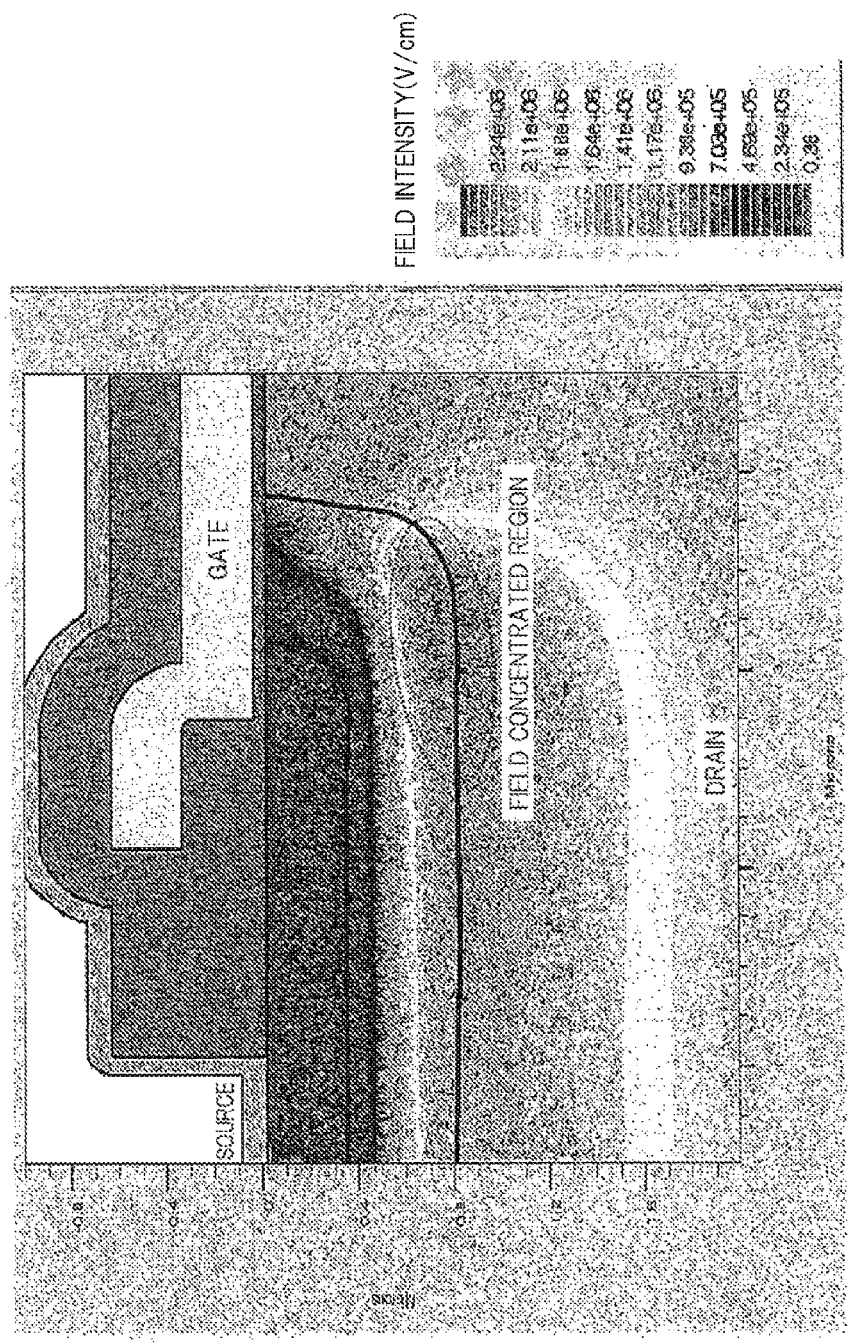
FIG. 4 is a diagram showing an electric field distribution of the silicon carbide semiconductor device of the conventional technique, which is obtained by simulation.
Figure 5:
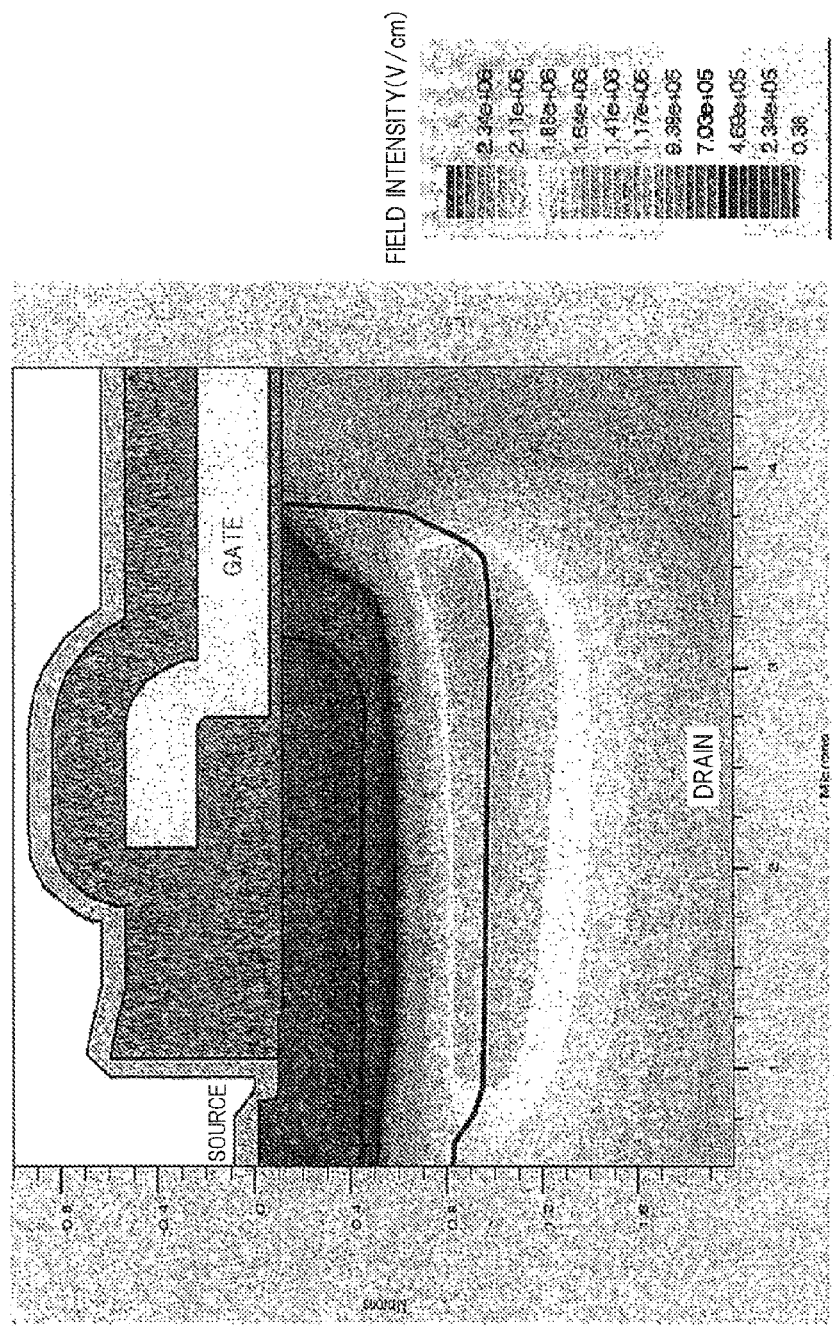
FIG. 5 is a diagram showing an electric field distribution of the silicon carbide semiconductor device according to the first embodiment of the present invention, which is obtained by simulation.
Figure 6A:
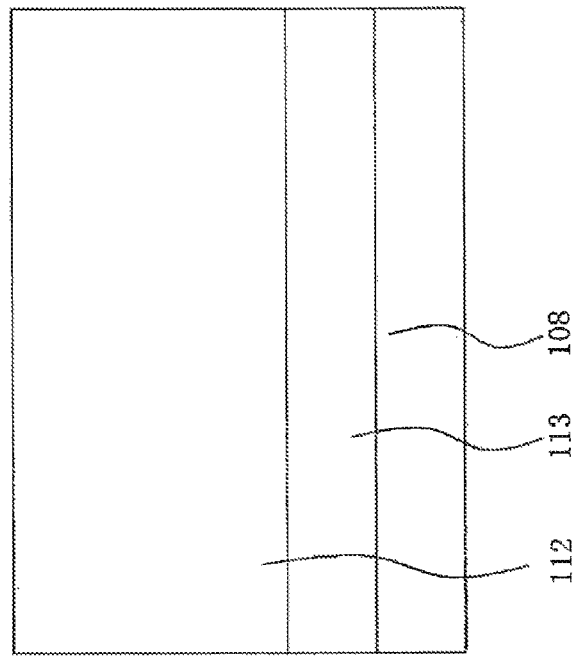
FIG. 6(a) is an explanatory cross-sectional view for describing a manufacturing method of a silicon carbide semiconductor device.
Figure 6B:
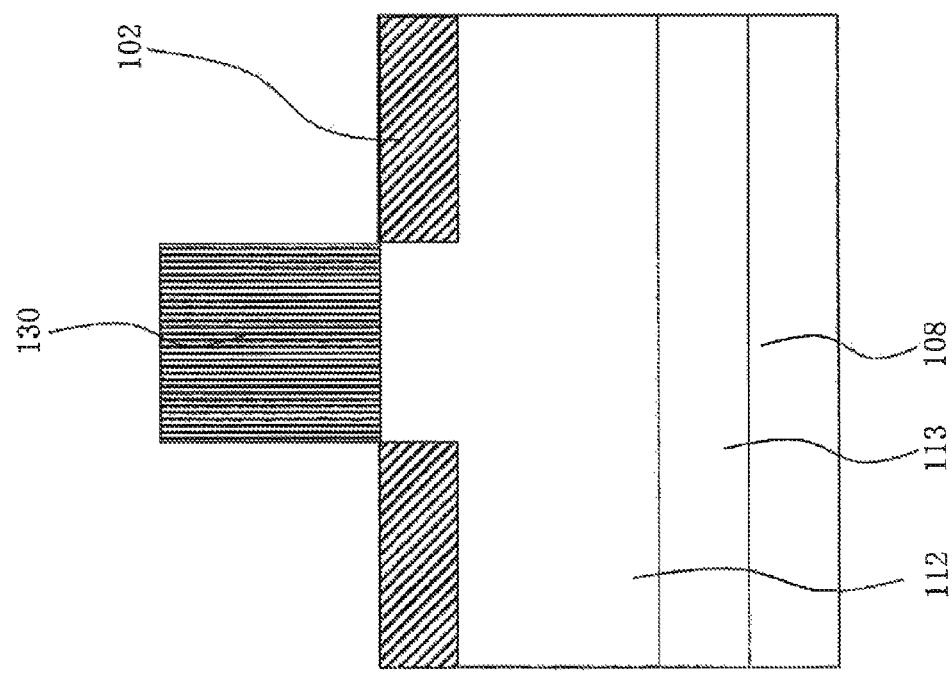
FIG. 6(b) is an explanatory cross-sectional view for describing the manufacturing method of the silicon carbide semiconductor device.
Figure 6C:
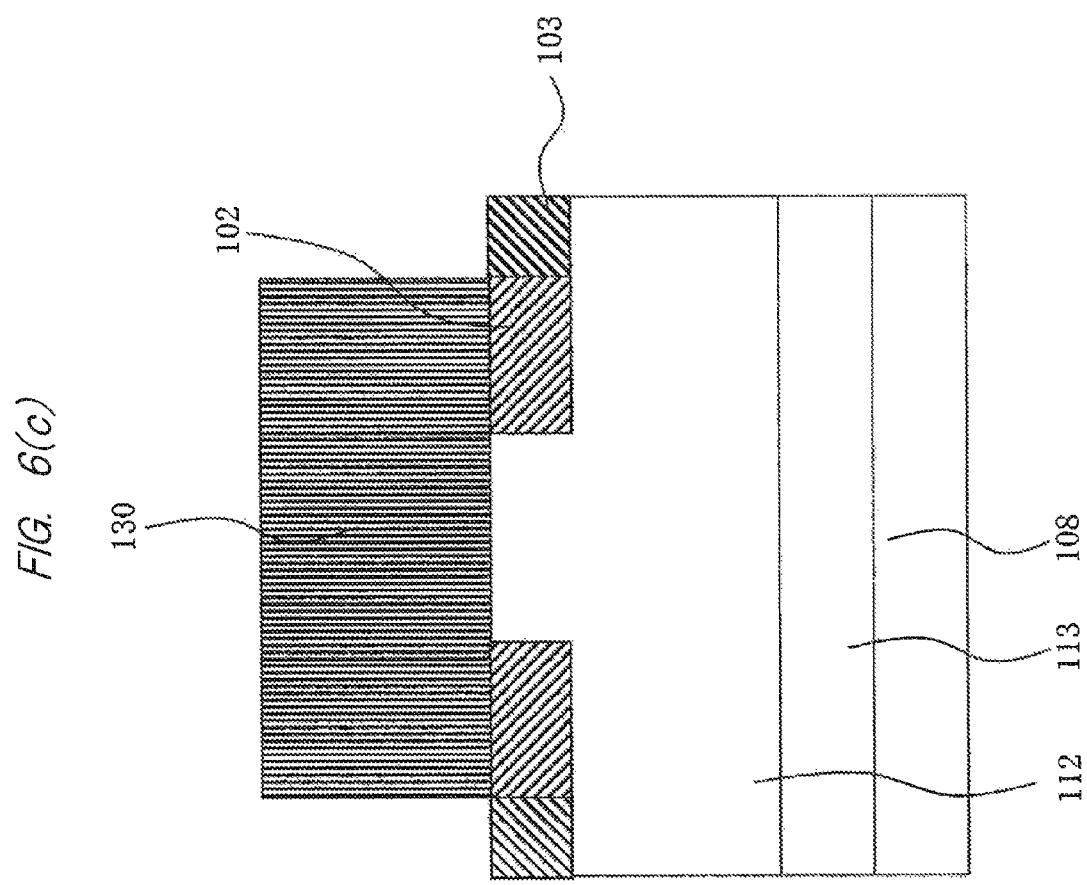
FIG. 6(c) is an explanatory cross-sectional view for describing the manufacturing method of the silicon carbide semiconductor device.
Figure 6F:
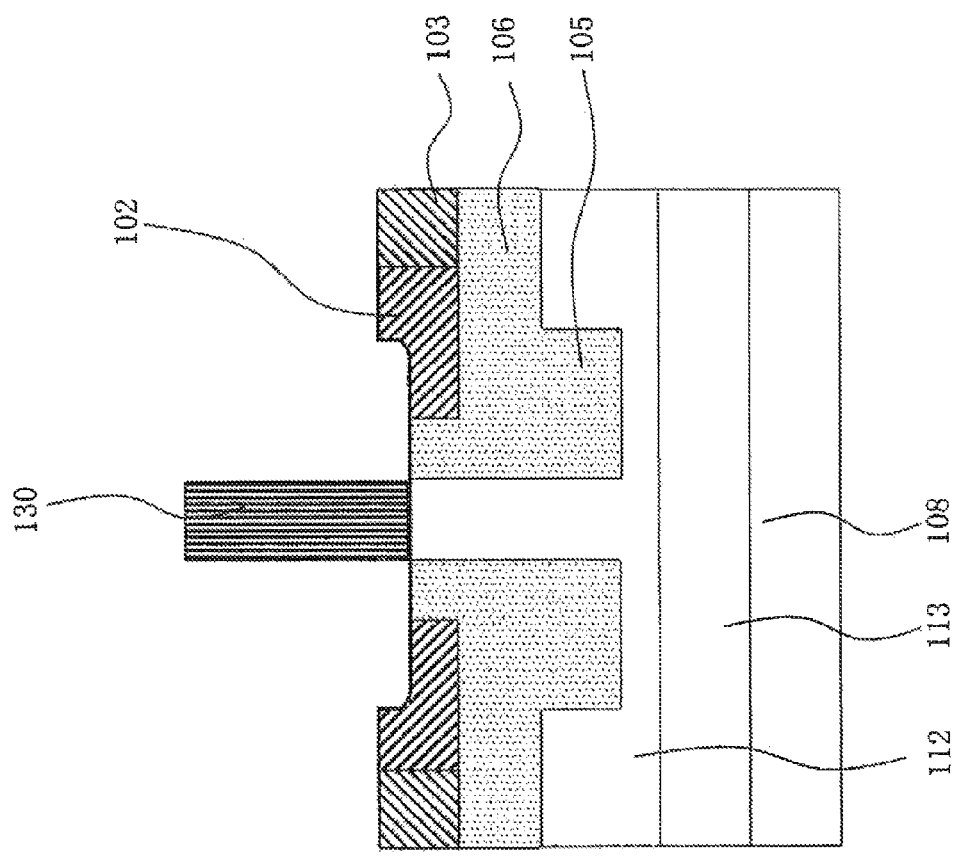
FIG. 6(f) is an explanatory cross-sectional view for describing the manufacturing method of the silicon carbide semiconductor device.
Figure 6G:
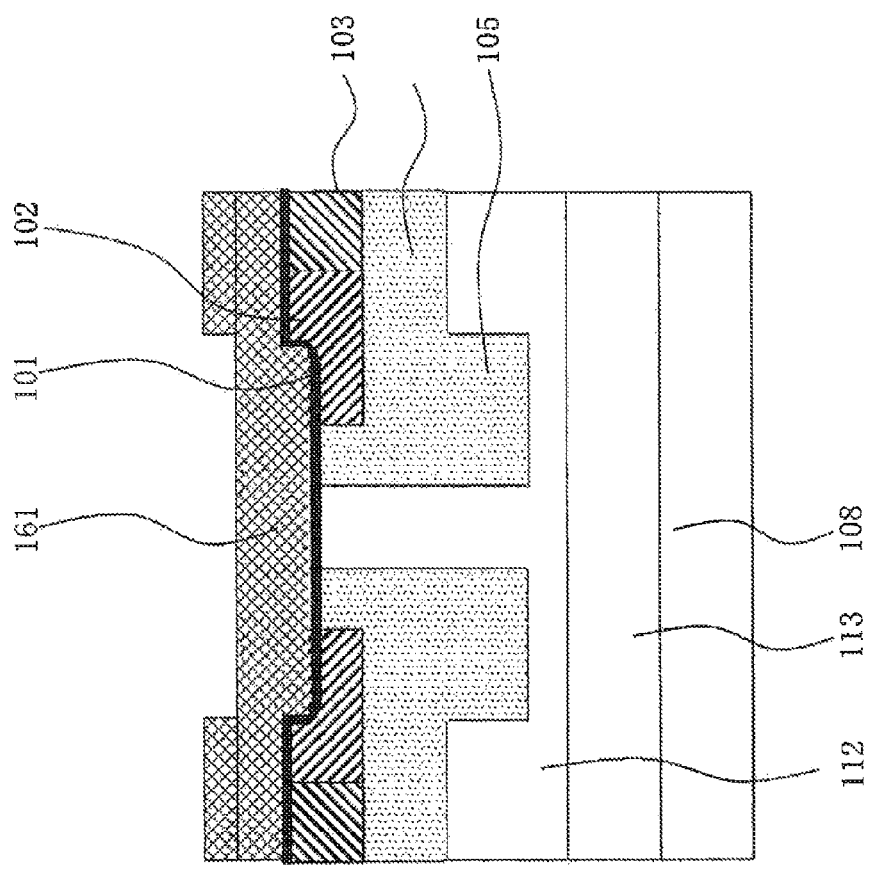
FIG. 6(g) is an explanatory cross-sectional view for describing the manufacturing method of the silicon carbide semiconductor device.
Figure 6H:
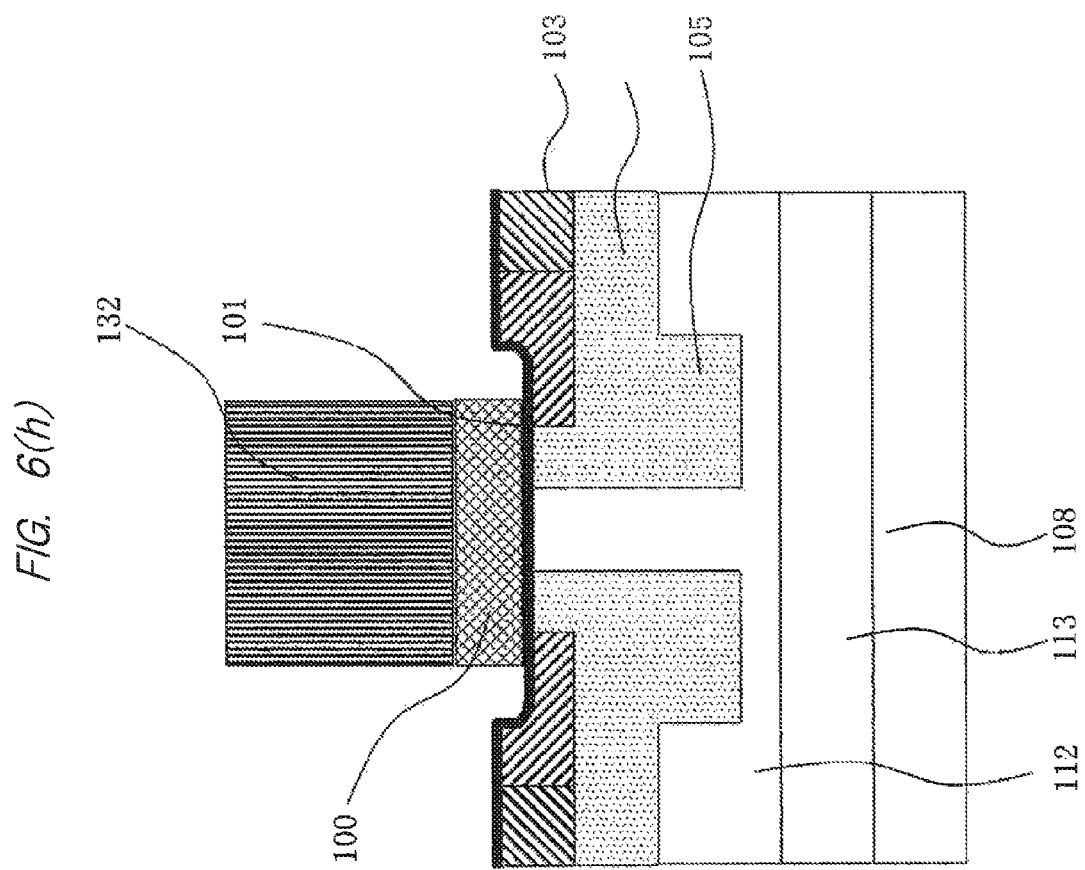
FIG. 6(h) is an explanatory cross-sectional view for describing the manufacturing method of the silicon carbide semiconductor device.
Figure 6I:
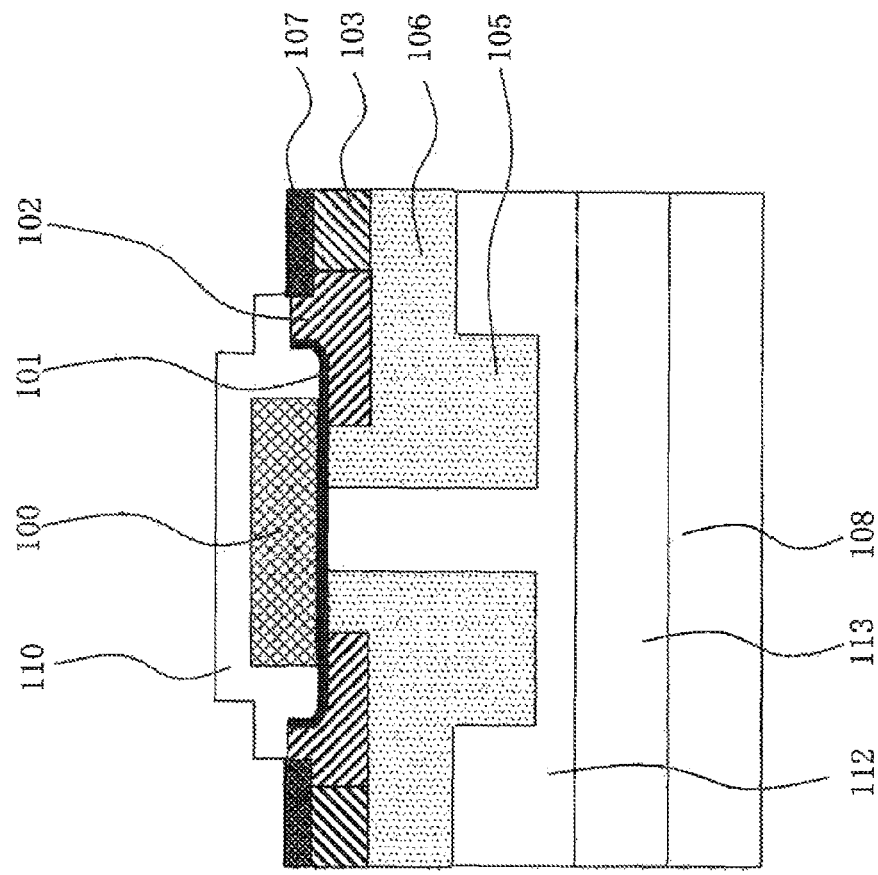
FIG. 6(i) is an explanatory cross-sectional view for describing the manufacturing method of the silicon carbide semiconductor device.
Figure 6K:
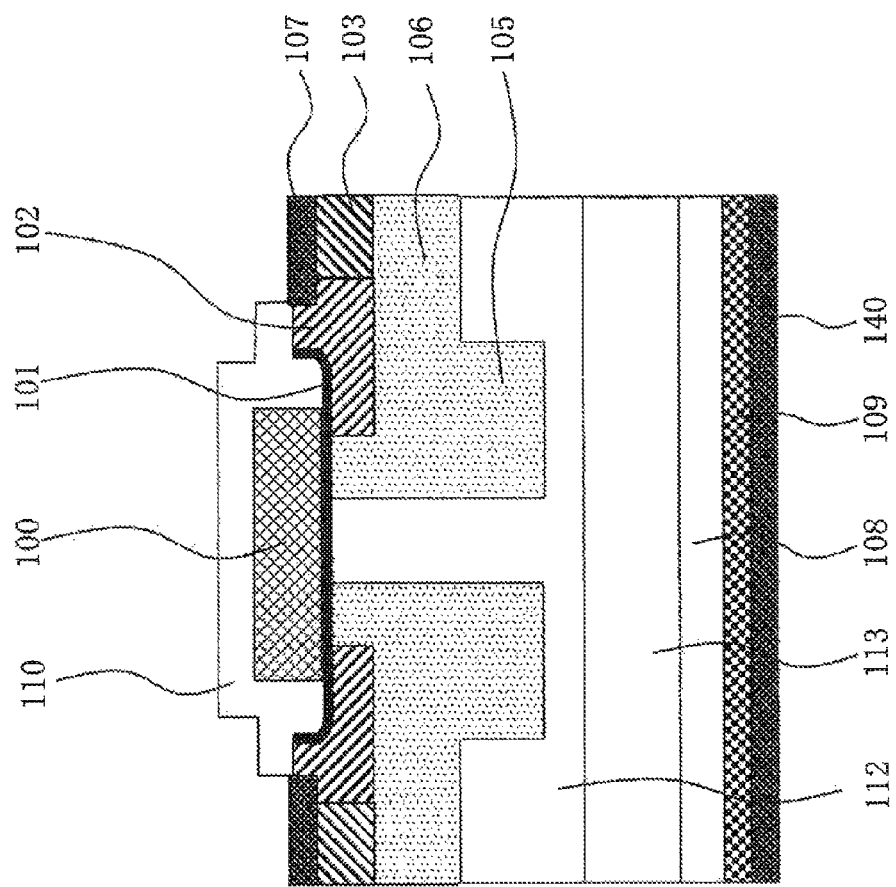
FIG. 6(k) is an explanatory cross-sectional view for describing the manufacturing method of the silicon carbide semiconductor device.
Figure 6L:
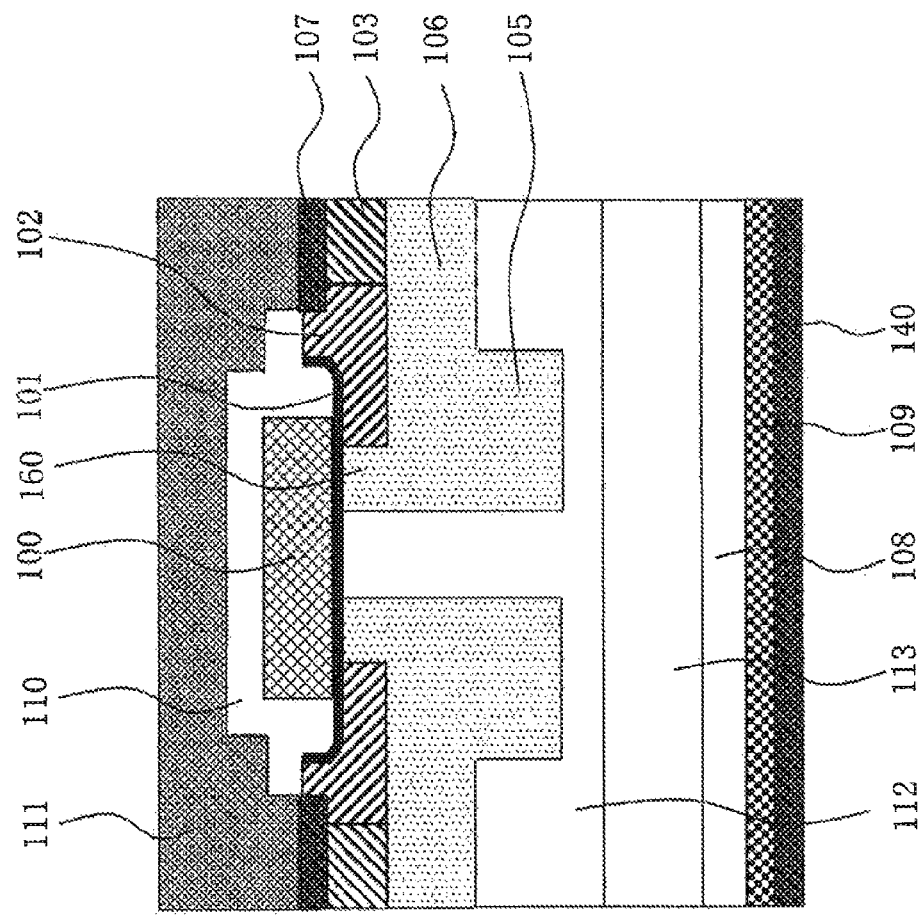
FIG. 6(l) is an explanatory cross-sectional view for describing the manufacturing method of the silicon carbide semiconductor device.

FIG. 2 is an explanatory diagram showing a planar structure of the semiconductor device of the first embodiment. As shown in FIG. 2, a semiconductor chip on which a silicon carbide semiconductor device is mounted is made up of an active region (SiC power MISFET formation region) 121 in which a plurality of n-channel-type SiC power MOSFETs are connected in parallel with one another and a peripheral formation region that surrounds the active region 121 when seen in a plan view. In the peripheral formation region, a plurality of p-type floating field limiting rings (FLR) 125, which are formed so as to surround the above-mentioned active region 121 when seen in a plan view, and an n⁺-type guard ring 124 formed so as to surround the plurality of p-type floating field limiting rings 125 when seen in a plan view are formed.

In the active region on the front surface side of the n-type SiC epitaxial substrate, a gate electrode, an n⁺-type source region, a channel region and the like of a SiC power MOSFET are formed, and on the rear surface side of the SiC epitaxial substrate, an n⁺-type drain region of the SiC power MOSFET is formed.

By forming the plurality of p-type floating field limiting rings 125 on the periphery of the active region 121, the maximum electric field portion sequentially moves toward the p-type floating field limiting rings 125 on the outer side at the off-time, and breakdown occurs on the outermost peripheral p-type floating field limiting ring 125, and thus the silicon carbide semiconductor device is allowed to have a high withstand voltage. FIG. 2 illustrates an example in which three p-type floating field limiting rings 125 are formed, but the present invention is not limited to this. Moreover, the n⁺-type guard ring 124 has a function of protecting the SiC power MOSFET formed in the active region 121.

The respective gate electrodes of the plurality of SiC power MOSFETs formed in the active region 121 are coupled to form stripe patterns when seen in a plan view, and the gate electrodes of all of the SiC power MOSFETs are electrically connected to a gate wiring electrode 122 by lead-out wirings (gate bus lines) connected to the respective stripe patterns. In FIG. 2, the gate electrodes are formed into stripe patterns, but they are not limited to these and may be formed into, for example, a box pattern, a polygonal pattern and the like.

Moreover, the respective source regions of the plurality of SiC power MOSFETs are electrically connected to a source wiring electrode 120 through openings 123 formed in an interlayer insulating film covering the plurality of SiC power MOSFETs. The gate wiring electrode 122 and the source wiring electrode 120 are formed so as to be spaced from each other, and the source wiring electrode 120 is formed on substantially the entire surface of the active region 121 except for the region in which the gate wiring electrode 122 is formed. Moreover, the n$^+$-type drain region formed on the rear surface side of the n-type SiC epitaxial substrate is electrically connected to the drain wiring electrode formed on the entire rear surface of the n-type SiC epitaxial substrate.

A manufacturing method of the silicon carbide semiconductor device of the first embodiment shown in FIG. 1 will be described with reference to FIG. 6(a) to FIG. 6(l). In this manufacturing method, since a body layer is formed after the source diffusion layer region is formed and then apart thereof is recessed, the body layer 105 is formed. Thus, in comparison with the conventional structure, since it is possible to widen the distances between the respective end portions and the source diffusion layer 110, it becomes possible to effectively widen the depletion layer and thus suppress the electric field from concentrating on these end portions. As a result, it is possible to provide a silicon carbide semiconductor device that can achieve both of the reduction of channel resistance by the reduction of gate length and the high element withstand voltage at the same time.

First, the silicon carbide semiconductor device is formed on a 4H—SiC substrate. An n-type impurity has been implanted into the SiC substrate. For example, this impurity is nitrogen and its impurity concentration is in a range from $1 \times 10^{18}$ to $1 \times 10^{21}$ cm$^{-3}$. Moreover, the front surface of the SiC substrate may be either a Si surface or a C (carbon) surface.

An n$^-$-type epitaxial layer 112 of SiC in which the n-type impurity has been implanted at a lower concentration than that of the SiC substrate 113 is epitaxially grown on the SiC substrate 113. The impurity concentration of the n$^-$-type epitaxial layer 112 is dependent on the device rating of the silicon carbide semiconductor device, and is, for example, in a range from $1 \times 10^{14}$ to $1 \times 10^{17}$ cm$^{-3}$.

Through the above-mentioned process, the SiC epitaxial substrate is completed. Next, on the rear surface of the SiC epitaxial substrate, an n$^+$-type diffusion layer region 108 serving as a drain is formed. The n$^+$-type diffusion layer region 108 desirably has a high impurity concentration, and the concentration is, for example, in a range from $1 \times 10^{19}$ to $1 \times 10^{21}$ cm$^{-3}$ (FIG. 6(a)).

Next, a source diffusion layer 102 is formed. A depth of the source diffusion layer 102 is about 0.5 μm, and its implantation energy is normally several hundreds keV. For this reason, a hard mask such as a SiO$_2$ (silicon oxide) mask is used as its mask in general. First, a SiO$_2$ film is deposited by a plasma CVD (chemical vapor deposition) apparatus to have a thickness of about 1 to 3 μm. Next, after a positive resist is applied, this is exposed and developed so that a resist pattern having a desired body layer shape is formed. Thereafter, the SiO$_2$ film is processed by dry etching and the resist is removed, so that a patterned mask 130 is formed on the SiC epitaxial substrate (FIG. 6(b)). Next, the n$^+$-type source diffusion layer regions 102 are formed by ion implantation. For example, the impurity is N (nitrogen) and the impurity concentration is in a range from $1 \times 10^{19}$ to $1 \times 10^{21}$ cm$^{-3}$ (FIG. 6(b)).

Next, in order to fix the potential of the body layers 105 and 106, a p$^+$ layer 103 is formed on the silicide layer formation portion. First, a SiO$_2$ film is deposited by using a plasma CVD apparatus. Next, after a positive resist is applied, this is exposed and developed so that a resist pattern having a desired body layer shape is formed. Thereafter, the SiO$_2$ film is processed by dry etching and the resist is removed, so that a patterned mask 130 is formed on the SiC epitaxial substrate (FIG. 6(c)). Next, p$^+$ layers 103 are formed by ion implantation. For example, the impurity is Al and the impurity concentration is in a range from $1 \times 10^{19}$ to $1 \times 10^{21}$ cm$^{-3}$ (FIG. 6(c)).

Next, in order to form the body layer 105, a part of the source diffusion layer 102 is recessed. First, a SiO$_2$ film is deposited by a plasma CVD apparatus. Next, after a positive resist is applied, this is exposed and developed so that a resist pattern having a desired body layer shape is formed. Thereafter, the SiO$_2$ film is processed by dry etching and the resist is removed, so that a patterned mask 130 is formed on the SiC epitaxial substrate (FIG. 6(d)).

Subsequently, the source diffusion layer regions 102 and the SiC epitaxial substrate are processed by, for example, dry etching, thereby forming a recess region 131 (FIG. 6(e)). The depth of the recess is, for example, in a range from 10 to 200 nm.

Next, the body layers 105 and 106 are formed. The depth of the body layers is as deep as 0.5 to 2 μm, and its implantation energy is normally several hundreds keV to several MeV. For this reason, a hard mask such as a SiO$_2$ (silicon oxide) mask is used as its mask in general. First, a SiO$_2$ film is deposited to have a thickness of about 1 to 3 μm by a plasma CVD (chemical vapor deposition) apparatus. Next, after a positive resist is applied, this is exposed and developed so that a resist pattern having a desired body layer shape is formed. Thereafter, the SiO$_2$ film is processed by dry etching and the resist is removed, so that a patterned mask 130 is formed on the SiC epitaxial substrate (FIG. 6(f)).

Next, a p-type impurity is ion-implanted to form the body layer. For example, the impurity is Al (aluminum) and the impurity concentration is in a range from $1 \times 10^{16}$ to $1 \times 10^{19}$ cm$^{-3}$ (FIG. 6(f)). Through the above-mentioned process, the body layer 105 which is further deeper than the conventional body layer 106 can be formed, so that the punch through which causes the reduction of withstand voltage can be suppressed.

After all the impurities have been implanted, the implanted impurities are activated. For the SiC activating thermal treatment, a temperature of 1500° C. or higher is required. However, in the case of the temperature of 1500° C. or higher, separation of Si atoms and implanted impurities from the SiC substrate surface occurs. Moreover, the surface flatness deteriorates. Therefore, prior to the activating thermal treatment, the front surface and rear surface of the SiC epitaxial substrate are coated with a carbon film. The carbon film is deposited on the front surface and rear surface of the SiC epitaxial substrate so as to have a thickness of about 30 nm by a plasma CVD apparatus. After coating the substrate with this carbon film, the activating thermal treatment is carried out for several minutes at a high temperature of 1500° C. or higher. After the activating thermal treatment, the coated carbon film is removed by oxygen plasma treatment.

Due to the coating of the carbon film, a layer with excessive carbon contained therein is formed in the vicinity of the SiC epitaxial substrate surface. In order to remove this layer, an edging process is carried out on the SiC epitaxial substrate surface in a high-temperature hydrogen atmosphere. The temperature at this time is desirably 1000° C. or higher. Moreover, by this edging process using the high-temperature hydrogen thermal treatment, edge portions of the source diffusion layer region 102 that have been previously formed by the recessing process can be rounded. It is desired that the edge portion on the source diffusion layer region side of the channel region 207 has an angle with a curvature of 5 nm or more. Note that the device may be formed without carrying out the hydrogen thermal treatment.

Next, the gate insulating film 101 and the gate electrode 100 are formed. It is desired that the gate insulating film 101 is formed from a SiON film as a surface layer of the SiC epitaxial substrate by using nitric monoxide gas. However, in order to make the film thickness of the gate insulating film 101 larger, it is desired to deposit a $SiO_2$ film by a thermal CVD apparatus and to form the gate insulating film 101 as a multilayer film (FIG. 6(g)). The film thickness of the gate insulating film 101 is in a range from 50 to 150 nm. After the gate insulating film 101 is formed, a Si film 161 serving as the gate electrode 100 is deposited. As the Si film 161, a polycrystalline Si film 161 into which P has been implanted is generally deposited (FIG. 6(g)). The film thickness of the polycrystalline Si film 161 is in a range from 100 to 500 nm. Subsequently, the polycrystalline Si film 161 is processed. After a positive resist is applied, this is exposed and developed so that a resist pattern 132 having a desired shape of the gate electrode 100 is formed. After the resist pattern 132 is formed, the Si film 161 is processed into a desired shape by dry etching, thereby forming the gate electrode 110 (FIG. 6(h)).

After removing the resist pattern 132, an interlayer film 110 is deposited by a plasma CVD apparatus. Thereafter, after the interlayer film 110 has been sintered at 1000° C., in order to form a wiring electrode for the $p^+$ layer 103 to fix the potentials of the source diffusion layer region 102 and the body layers 105 and 106, a part of the interlayer film 110 and the gate insulating film 101 is opened to form a contact region. After a positive resist is applied, this is exposed and developed to form a resist mask 132 for obtaining a desired opening shape. Next, the interlayer film 110 and the gate insulating film 101 are processed into desired shapes by dry etching, thereby forming a contact region (FIG. 6(i)).

Subsequently, in order to lower the contact resistance between each of the source diffusion layer region 102 and the $p^+$ layer 103 and the wiring electrode, a metal silicide layer 107 is formed on the source diffusion layer region 102 and the $p^+$ layer 103. First, a metal film is deposited to have a thickness of about 20 nm by using a magnetron sputtering apparatus. After depositing the metal film, silicidation annealing in a temperature range from 500° C. to 900° C. is carried out to make the metal film react with the SiC epitaxial substrate, thereby forming the metal silicide layer 107. Next, an unreacted metal film is removed by using wet etching. For the wet etching to remove the metal film, for example, a hydrolyzing process using sulfuric acid is used (FIG. 6(j)).

Next, a metal silicide layer 109 is formed so as to cover the $n^+$-type diffusion layer region 108 on the rear surface. On the rear surface of the SiC epitaxial substrate, a metal film is deposited to have a thickness of about 100 nm by using a magnetron sputtering apparatus. Next, silicidation annealing in a temperature range from 800° C. to 1200° C. is carried out to make the metal film react with the SiC epitaxial substrate, thereby forming the metal silicide layer 109 (FIG. 6(k)). Thereafter, a metal film 140 is deposited to have a desired film thickness so as to cover the metal silicide layer 109 on the rear surface.

Next, in order to form a wiring electrode on the gate 100, a part of the interlayer film 110 is opened. After a positive resist is applied, this is exposed and developed to form a resist pattern having a desired gate opening shape. After the formation of the resist pattern, this is processed into a desired shape by dry etching. Subsequently, a source wiring electrode 111 and a gate wiring electrode are formed. As the electrode, titanium, titanium nitride and aluminum are deposited by a metal CVD apparatus (FIG. 2(r)). The film thickness of the aluminum film is desirably 2 µm or more by taking the connection to the wiring into consideration. After the metal film for the electrodes has been deposited, an excessive metal film is removed. At this time, the separation of the source wiring electrode 111 and the gate wiring electrode is also carried out. Thereafter, a wiring is connected to the source wiring electrode, and a wiring is connected also to the gate wiring electrode.

As described above, a silicon carbide semiconductor device having the deep body layer 105 can be formed according to the first embodiment. In this structure, in comparison with the conventional technique, since a body layer is formed after a source diffusion layer region is formed and then apart thereof is recessed, the body layer 105 which is further deeper than the conventional body layer 106 can be formed. In comparison with the conventional structure, since the presence of the body layer 105 makes it possible to widen the distances between the respective end portions and the source diffusion layer 102, it becomes possible to effectively widen the depletion layer and suppress the electric field concentration on these end portions. As a result, the withstand voltage characteristics can be improved. Thus, it becomes possible to provide a silicon carbide semiconductor device capable of achieving both of the reduction of channel resistance by the reduction of gate length and the high element withstand voltage at the same time.

EXPLANATION OF REFERENCE CHARACTERS

100 . . . gate electrode, 101 . . . gate insulating film, 102 . . . source diffusion layer, 103 . . . $p^+$ layer, 105 . . . deep body layer, 106 . . . body layer, 107 . . . front surface metal silicide layer, 108 . . . drain diffusion layer region, 109 . . . rear surface metal silicide layer, 110 . . . interlayer film, 111 . . . source electrode, 112 . . . SiC epitaxial layer, 113 . . . SiC substrate, 120 . . . source wiring electrode, 121 . . . active region, 122 . . . gate wiring electrode, 123 . . . opening, 124 . . . guard ring, 125 . . . p-type floating field limiting ring, 130, 132 . . . mask layer, 131 . . . recess region, 140 . . . metal film, 160 . . . channel region

The invention claimed is:

1. A silicon carbide semiconductor device comprising:
   a substrate of a first conductivity type having a first main surface and a second main surface opposite to the first main surface and made of silicon carbide;
   an epitaxial layer made of silicon carbide formed on the first main surface of the substrate;
   a first body layer of a second conductivity type different from the first conductivity type formed in the epitaxial layer;
   a second body layer of the second conductivity type different from the first conductivity type formed in the epitaxial layer;
   a first source region of the first conductivity type formed in the first body layer;
   a second source region of the first conductivity type formed in the second body layer;
   a first channel region of the second conductivity type formed in contact with the first source region positioned in the first body layer located between a lateral end portion of the first body layer and a lateral end portion of the first source region;
   a second channel region of the second conductivity type formed in contact with the second source region positioned in the second body layer located between a lateral end portion of the second body layer and a lateral end portion of the second source region;

a gate insulating film formed in contact with the first channel region and the second channel region;

a gate electrode formed in contact with the gate insulating film; and a drain region of the first conductivity type formed in the substrate so as to have a predetermined depth from the second main surface of the substrate, wherein the first and second source regions and the first and second channel regions are recessed.

2. The silicon carbide semiconductor device according to claim 1, wherein a junction depth of the body layer in a region where the source region and the channel region are recessed is deeper than a junction depth of the body layer in a region where the source region is not recessed.

3. The silicon carbide semiconductor device according to claim 1, wherein a lateral end portion of the body layer formed by a difference in junction depth between the body layer in a region where the source region and the channel region are recessed and the body layer in a region where the source region is not recessed is disposed on an outer side compared with a lateral end portion of the recessed source region.

4. The silicon carbide semiconductor device according to claim 1, wherein a difference in junction depth between the body layer in a region where the source region and the channel region are recessed and the body layer in a region where the source region is not recessed is in a range from 10 to 200 nm.

5. A method of manufacturing a silicon carbide semiconductor device comprising the steps of:

preparing a substrate of a first conductivity type having a first main surface and a second main surface opposite to the first main surface and made of silicon carbide;

forming an epitaxial layer made of silicon carbide on the first main surface of the substrate;

forming a first body layer of a second conductivity type different from the first conductivity type in the epitaxial layer;

forming a second body layer of the second conductivity type different from the first conductivity type in the epitaxial layer;

forming a first source region of the first conductivity type in the first body layer;

forming a second source region of the first conductivity type in the second body layer;

forming a first channel region of the second conductivity type in contact with the first source region positioned in the first body layer located between a lateral end portion of the first body layer and a lateral end portion of the first source region;

forming a second channel region of the second conductivity type in contact with the second source region positioned in the second body layer located between a lateral end portion of the second body layer and a lateral end portion of the second source region;

forming a gate insulating film in contact with the first channel region and the second channel region;

forming a gate electrode in contact with the gate insulating film;

forming a drain region of the first conductivity type in the substrate so as to have a predetermined depth from the second main surface of the substrate; and recessing the first and second source regions and the first and second channel regions, wherein the body layers are formed after forming the recessed regions.

6. The manufacturing method of a silicon carbide semiconductor device according to claim 5, wherein a junction depth of the body layer in a region where the source region and the channel region are recessed is deeper than a junction depth of the body layer in a region where the source region is not recessed.

7. The manufacturing method of a silicon carbide semiconductor device according to claim 5, wherein a lateral end portion of the body layer formed by a difference in junction depth between the body layer in a region where the source region and the channel region are recessed and the body layer in a region where the source region is not recessed is disposed on an outer side compared with a lateral end portion of the recessed source region.

8. The manufacturing method of a silicon carbide semiconductor device according to claim 5, wherein a difference in junction depth between the body layer in a region where the source region and the channel region are recessed and the body layer in a region where the source region is not recessed is in a range from 10 to 200 nm.

* * * * *